(12) United States Patent
Chang et al.

(10) Patent No.: US 6,350,693 B2
(45) Date of Patent: Feb. 26, 2002

(54) METHOD OF CMP OF POLYSILICON

(75) Inventors: Chung-Long Chang, Dou-Liu; Syun-Ming Jang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/755,278

(22) Filed: Jan. 8, 2001

Related U.S. Application Data

(62) Division of application No. 09/186,390, filed on Nov. 5, 1998, now Pat. No. 6,191,039.

(30) Foreign Application Priority Data

Nov. 15, 1997 (TW) .......................... 86117082 A

(51) Int. Cl.[7] ...................... H01L 21/302; H01L 21/461
(52) U.S. Cl. ...................... 438/692; 438/959
(58) Field of Search ................... 438/692, 626, 438/631, 632, 633, 689, 691, 693, 627, 629, 672, 685, 959

(56) References Cited

U.S. PATENT DOCUMENTS

| 5,312,512 | A |   | 5/1994  | Allman et al. ............. 156/636 |
| 5,498,562 | A |   | 3/1996  | Dennison et al. ............. 437/52 |
| 5,633,190 | A |   | 5/1997  | Sugiyama ................... 438/404 |
| 5,676,587 | A | * | 10/1997 | Landers et al. ............... 451/57 |
| 6,191,039 | B1| * | 2/2001  | Chang et al. ............... 438/692 |

* cited by examiner

Primary Examiner—David Nelms
Assistant Examiner—David Nhu
(74) Attorney, Agent, or Firm—George O. Saile; Stephen B. Ackerman

(57) ABSTRACT

An improved and new process for fabricating a planarized structure of polysilicon plugs embedded in silicon oxide has been developed. The planarizing method comprises a two-step CMP process in which the first CMP step comprises chemical-mechanical polishing using a first polishing slurry which is selective to polysilicon and the second CMP step comprises chemical-mechanical polishing using a second polishing slurry which polishes both polysilicon and silicon oxide. The processing time of the two-step CMP process is significantly less than the processing time of a one-step CMP process requiring an over-polish period. This reduced processing time reduces the cost of the CMP operation and at the same time produces a product with superior planarity and without reliability degradation due to residues of polysilicon.

8 Claims, 5 Drawing Sheets

METHOD OF CMP OF POLYSILICON

This ia a division of U.S. patent application Ser. No. 09/186,390, filing date Nov. 5, 1998, Improved Method Of Polysilicon, assigned to the same assignee as the present invention.

BACKGROUND OF THE INVENTION (1) Field of the Invention

This invention relates to a method of fabrication used for semiconductor integrated circuit devices, and more specifically to the formation of a planarized structure of polysilicon or other conductor materials embedded in an insulator.

The method of fabrication can, also, be used to fabricate polysilicon DRAM cylindrical capacitors for use in semiconductor integrated circuit devices.

(2) Description of Related Art

In the fabrication of semiconductor integrated circuits CMP (Chemical Mechanical Polishing) can be used to remove different layers of material from the surface of a semiconductor substrate. For example, following via hole formation in an insulating layer, a metallization layer is deposited and then CMP is used to produce planar metal plugs embedded in the insulating layer. Similarly, interconnection wiring can be formed by first etching wiring channels into an insulating layer and then depositing a metallization layer onto the insulating layer and into the etched channels. CMP is then used to selectively remove the metallization layer from the surface of the insulating layer, leaving the metallization material embedded in the etched channels. Also, CMP has been developed for providing smooth topographies on insulating layers deposited on semiconductor substrates. It is desirable that the insulating layers have smooth topography, since it is difficult to lithographically image and pattern layers applied to rough surfaces.

An important challenge in CMP, when selectively removing a second material layer from a first material layer, is to remove the second material without removing an excessive amount of the underlying first material layer. Also, it is important to not leave residues of the second material on the surface of the first material. Conventional practice is to utilize a polishing slurry which has high selectivity for removal of the second material layer over the first material layer, detecting when the surface of the first material layer is reached, and then in order to remove residues of the second material layer on the surface of the first material the conventional practice is to provide an over-polish period beyond the detected endpoint for removing the second material over the first material. This over-polish period, which may be 50 to 100% greater than the detected polishing endpoint, adds additional processing time and, therefore, additional cost. Furthermore, during the CMP over-polish period excessive amount of the underlying first material may be removed on some regions of the substrate and the within-cell and cell-to-periphery planarity could be degraded.

U.S. Pat. No. 5,498,562 entitled "Semiconductor Processing Methods Of Forming Stacked Capacitors" granted Mar. 12, 1996 to Charles H. Dennison et al describes a method of forming a stacked capacitor wherein the electrode is defined using a CMP (Chemical Mechanical Polishing) process. A multi-container stacked capacitor construction has its containers defined or otherwise electrically isolated in a single CMP (Chemical Mechanical Polishing) step.

U.S. Pat. No. 5,633,190 entitles "Semiconductor Device and Method For Making the Same" granted May 27, 1997 to Mitsuhiro Sugiyama shows a method of planarizing oxide over high and low regions.

U.S. Pat. No. 5,312,512 entitled "Global Planarization Using SOG and CMP" granted May 17, 1994 to Derryl D. J. Allman et al describes a method of planarizing metal lines using SOG (Spin On Glass) and CMP (Chemical Mechanical Polishing).

The present invention is directed to a novel method of using CMP to selectively remove a second material over a first material and produce a planar first material surface, free of second material residue. The method of the present invention requires less CMP processing time, has lower cost than conventional CMP methods and produces a polished surface having superior planarity.

SUMMARY OF THE INVENTION

It is a general object of the present invention to provide an improved method of forming an integrated circuit in which a two-step CMP (chemical-mechanical polishing) process is used to selectively remove a second material over a first material and produce a planar first material surface, free of second material residue.

A more specific object of the present invention is to provide an improved method of forming an integrated circuit in which a two-step CMP process is used to selectively remove a conductive material over an insulator material and produce a planar insulator surface, free of conductive material residue.

Another object of the present invention is to provide an improved method of forming a planarized memory cell having cylindrical capacitors on a semiconductor substrate, in which a two-step CMP process is used to selectively remove doped polysilicon formed over a layer of silicon oxide.

In accordance with the present invention, the above and other objectives are realized by using a method of fabricating a planarized structure on a semiconductor substrate, wherein a second material is embedded in a first material, the method comprising the following steps: providing a semiconductor substrate having a layer of first material deposited thereon and into which are etched contact/container openings; providing a layer of second material above the layer of first material and within the contact/container openings; chemical-mechanical polishing the layer of second material to the layer of first material by a two-step process, the first CMP step comprising chemical-mechanical polishing using a first polishing slurry which is selective to said second material; and further chemical-mechanical polishing the layer of second material by a second CMP step comprising chemical-mechanical polishing using a second polishing slurry which polishes both the second material and the first material.

In a second embodiment of the present invention, the above and other objectives are realized by using a method of fabricating a planarized structure on a semiconductor substrate, wherein doped polysilicon plugs are embedded in contact openings in a layer of silicon oxide, the method comprising the following steps: providing a semiconductor substrate having a layer of silicon oxide deposited thereon and into which are etched contact openings; providing a layer of doped polysilicon above the layer of silicon oxide and within the contact openings; chemical-mechanical polishing the layer of doped polysilicon to the layer of silicon oxide by a two-step process, the first CMP step comprising chemical-mechanical polishing using a first polishing slurry which is selective to said doped polysilicon; and further chemical-mechanical polishing the layer of doped polysilicon by a second CMP step comprising chemical-mechanical polishing using a second polishing slurry which polishes both the doped polysilicon and the silicon oxide.

In a third embodiment of the present invention, the above and other objectives are realized by using a method of fabricating a planarized memory cell having cylindrical capacitors on a semiconductor substrate, the method comprising the following steps: providing a semiconductor substrate having a layer of silicon oxide deposited thereon and into which are etched cylindrical openings; providing a layer of doped polysilicon above the layer of silicon oxide and within the cylindrical openings, the layer of doped polysilicon being provided to a thickness which is less than one half the diameter of the cylindrical openings; chemical-mechanical polishing the layer of doped polysilicon to the layer of silicon oxide by a two-step process, the first CMP step comprising chemical-mechanical polishing using a first polishing slurry which is selective to said doped polysilicon; and further chemical-mechanical polishing the layer of doped polysilicon by a second CMP step comprising chemical-mechanical polishing using a second polishing slurry which polishes both the doped polysilicon and the silicon oxide.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of using CMP to selectively remove a second material over a first material and produce a planar first material surface, free of second material residue will now be described in detail.

Figure 1A:
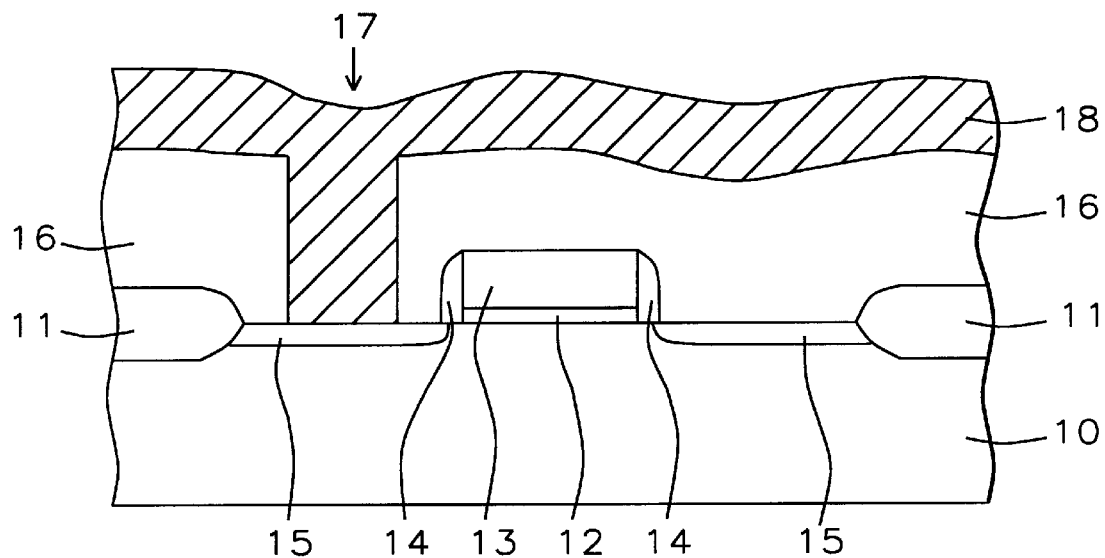
FIGS. 1A–1C, which in cross-sectional representation illustrate the method of one embodiment of the present invention.

Referring to FIG. 1A, a semiconductor substrate 10 has MOS device features, such as field oxide 11, gate oxide 12, polysilicon gate electrode 13, sidewall spacers 14, and source and drain regions 15 formed thereon. Also, provided is a layer of first material 16 formed thereon and an etched contact opening 17 in the first material layer 16. Formed on the surface of the first material layer 16 and within the contact opening 17 is a second material layer 18. The object of the invention is to in a cost effective manner selectively remove the second material layer 18 from the surface of first material layer 16 and produce a planar top surface on first material layer 16 which is free of residues of second material layer 18.

Figure 1B:
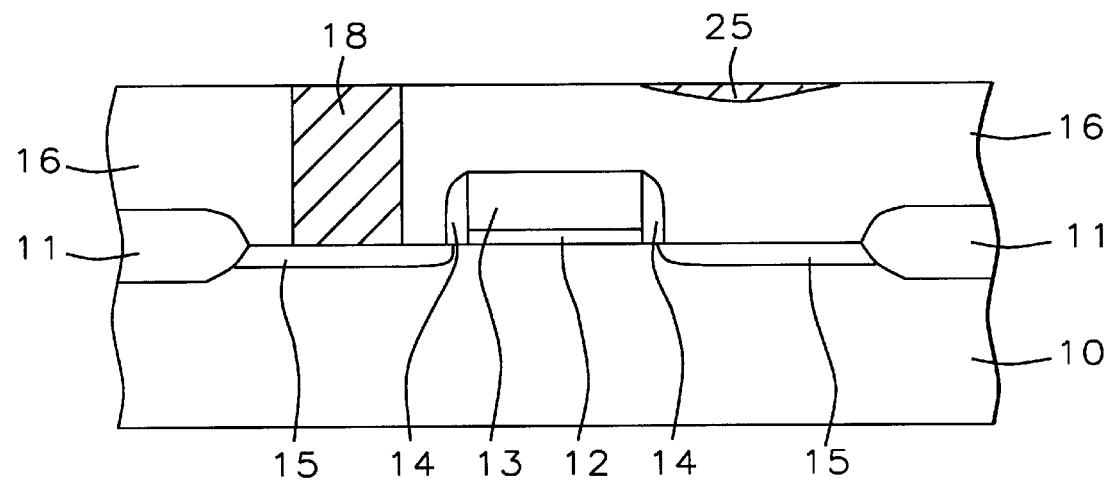
Figure 1C:
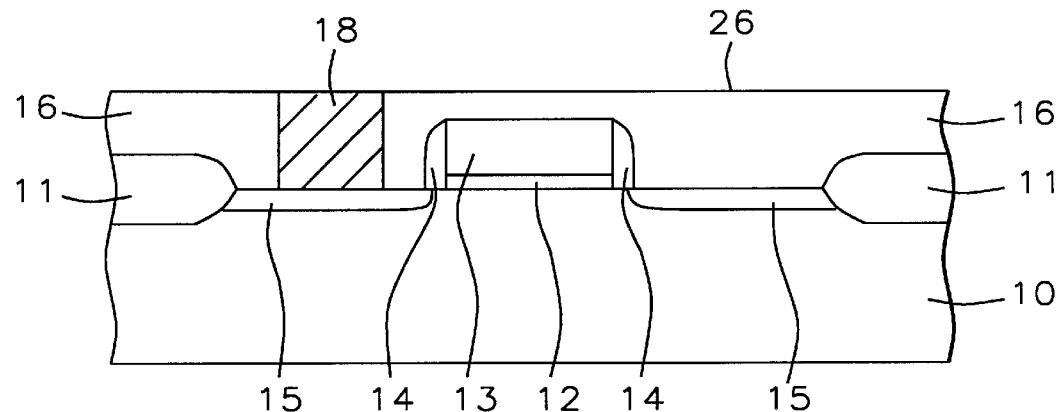

The invention comprises using a two-step CMP process in which the first CMP step comprises chemical-mechanical polishing using a first polishing slurry which is selective to the second material. For example, when the second material is doped polysilicon deposited over a first material comprising silicon oxide a CMP slurry comprising silica or alumina abrasive particles and a chemical solution of KOH and water, having a pH between about pH=9.5 and pH=10.5, produces suitable polishing selectivity for polysilicon compared to silicon oxide. Cabot Corp., Cab-O-Sil Division produces a suitable CMP slurry and markets the slurry as SEMI-SPERSE® EP-P1000. SEMI-SPERSE® EP-P1000 polishes doped polysilicon at a rate between about 200 and 300 times faster than the polishing rate for silicon oxide. For example, the above slurry polishes doped polysilicon at a rate of about 3000 to 4000 Angstroms per min., non-doped polysilicon at a rate of about 2500 to 3700 Angstroms per min., and silicon oxide (deposited by PECVD using TEOS) at rate of about 5 to 15 Angstroms per min. Therefore, this polishing slurry allows selective removal of the doped polysilicon from the surface of the silicon oxide without removing a significant amount of the silicon oxide. However, as shown in FIG. 1B, residues 25 of the second material layer remain in depressed regions or in regions where the first CMP step is surpressed. Conventional CMP methods are to provide an over-polish period beyond the detected endpoint for removing the second material over the first material. This over-polish period, which may be 50 to 100% greater than the detected polishing endpoint, adds additional processing time and, therefore, additional cost. Furthermore, during the CMP over-polish period excessive amount of the underlying first material may be removed on some regions of the substrate. The present invention does not utilize an over-polish period following the first CMP step, but switches to a second CMP step which comprises chemical-mechanical polishing using a second polishing slurry which polishes both the second material and the first material. For example, when the second material is doped polysilicon deposited over a first material comprising silicon oxide a second polishing slurry comprising silica abrasive particles and a chemical solution of KOH and water, having a pH between about pH=10.20 and pH=10.35, polishes polysilicon and silicon oxide at approximately equal rates. Cabot Corp., Cab-O-Sil Division produces a suitable CMP slurry and markets the slurry as CAB-O-SPERSE® SC-112. Utilizing this second CMP step effectively removes the second material residues and planarizes the surface of the first material. The processing time of the two-step CMP process is significantly less than the processing time of a one-step CMP process requiring an over-polish period. This reduced processing time reduces the cost of the CMP operation and at the same time produces a product with superior planarity and without reliability degradation due to residues of the second material. As shown in FIG. 1C, after the two-step CMP process the surface 26 of the first material 16 is planar and without residues of the second material 18.

Figure 2:
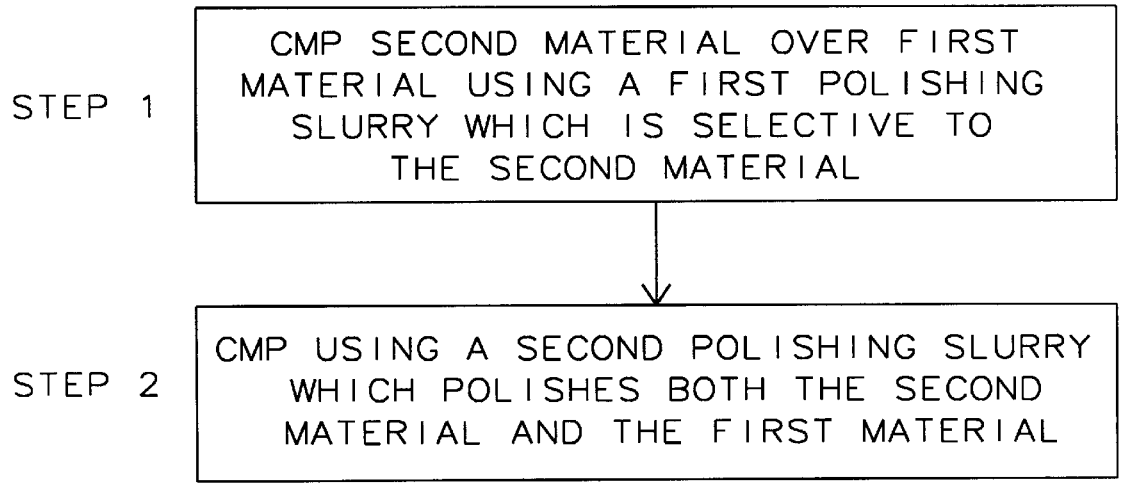
FIG. 2 is a flow chart of the method of the preferred embodiment of the present invention.

FIG. 2 is a flow chart of the method of the preferred embodiment of the present invention. The two-step CMP process of the invention comprises CMP Step 1 which comprises chemical-mechanical polishing using a first polishing slurry which is selective to the second material; and CMP Step 2 which comprises chemical-mechanical polishing using a second polishing slurry which polishes both the second material and the first material.

The two-step CMP process of the present invention may be practiced on a CMP apparatus having a single polishing platen. The two steps are effected by first flowing the first polishing slurry which is selective to the second material and then, following exposure of the first material, switching to the second polishing slurry which polishes both the second material and the first material. Alternately, the two-step CMP process of the present invention may be practiced utilizing two CMP apparatuses, having two separate platens, in which the first CMP polishing step is practiced by flowing the first polishing slurry on a first polishing platen and polishing until the first material is exposed. Then the substrate is transferred to a second polishing apparatus, having a second polishing platen for the second CMP polishing step. The second polishing apparatus has the second polishing slurry flowing on the platen. In either practice the cost of CMP processing is reduced because the total CMP processing time is less for the two-step CMP process than the time of a conventional single-step CMP process requiring over-polish time to remove residues.

Figure 3A:
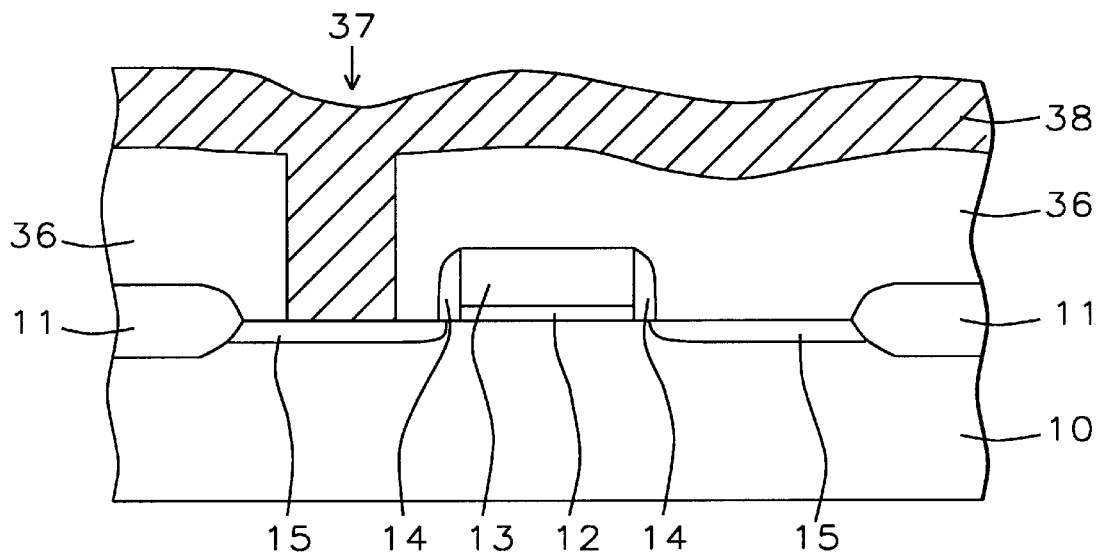
FIGS. 3A–3C, which in cross-sectional representation illustrate the method of a second embodiment of the present invention.
Figure 3B:
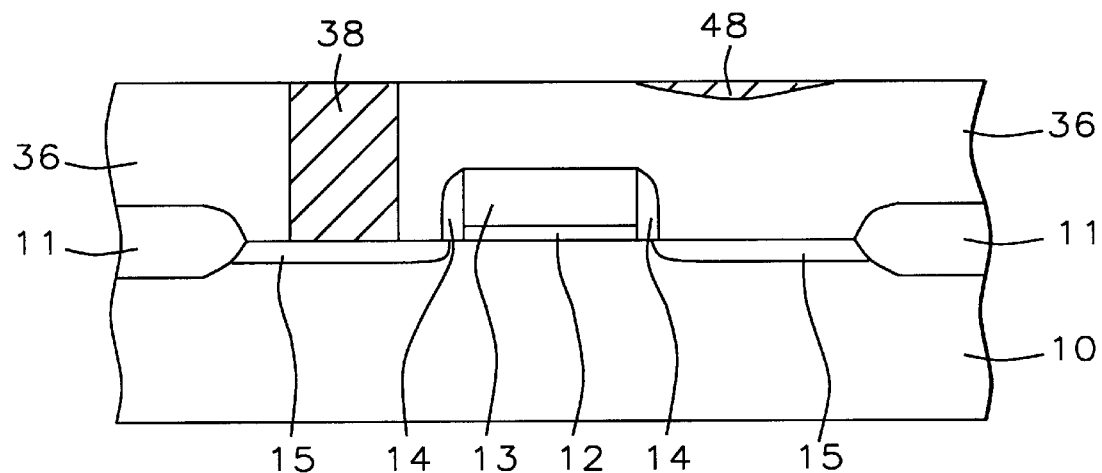
Figure 3C:
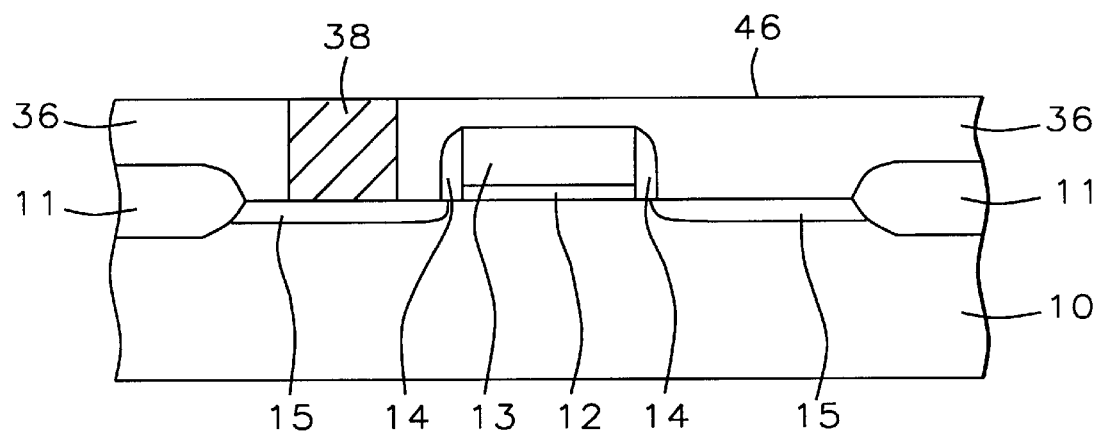

A second embodiment of the present invention is illustrated in FIGS. 3A–3C. Referring to FIG. 3A, a semiconductor substrate 10 has MOS device features, such as field oxide 11, gate oxide 12, polysilicon gate electrode 13, sidewall spacers 14, and source and drain regions 15 formed thereon. Also, provided is a layer of silicon oxide 36 formed thereon and an etched contact opening 37 in the silicon oxide layer 36. Formed on the surface of the silicon oxide layer 36 and within the contact opening 37 is a doped polysilicon layer 38. The object of the invention is to in a cost effective manner fabricate planarized doped polysilicon contact plugs embedded in the silicon oxide layer by selectively removing the doped polysilicon layer 38 from the surface of silicon oxide layer 36 and producing a planar top surface on silicon oxide layer 36 which is free of residues of doped polysilicon layer 38.

The invention comprises using a two-step CMP process in which the first CMP step comprises chemical-mechanical polishing using a first polishing slurry which is selective to doped polysilicon. For example, a CMP slurry comprising silica or alumina abrasive particles and a chemical solution of KOH and water, having a pH between about pH=9.5 and pH=10.5, produces suitable polishing selectivity for polysilicon compared to silicon oxide. Cabot Corp., Cab-O-Sil Division produces a suitable CMP slurry and markets the slurry as SEMI-SPERSE® EP-P1000. SEMI-SPERSE® EP-P1000 polishes doped polysilicon at a rate between about 200 and 300 times faster than the polishing rate for silicon oxide. This polishing slurry allows selective removal of the doped polysilicon from the surface of the silicon oxide without removing a significant amount of the silicon oxide. However, as shown in FIG. 3B, residues 48 of the doped polysilicon layer remain in depressed regions or in regions where the first CMP step is surpressed. Conventional CMP methods are to provide an over-polish period beyond the detected endpoint for removing the doped polysilicon over the silicon oxide. This over-polish period, which may be 50 to 100% greater than the detected polishing endpoint, adds additional processing time and, therefore, additional cost. Furthermore, during the CMP over-polish period excessive amount of the underlying silicon oxide may be removed on some regions of the substrate. The present invention does not utilize an over-polish period following the first CMP step, but switches to a second CMP step which comprises chemical-mechanical polishing using a second polishing slurry which polishes both doped polysilicon and silicon oxide. For example, a second polishing slurry comprising silica abrasive particles and a chemical solution of KOH and water, having a pH between about pH=10.20 and pH=10.35, polishes polysilicon and silicon oxide at approximately equal rates. Cabot Corp., Cab-O-Sil Division produces a suitable CMP slurry and markets the slurry as CAB-O-SPERSE® SC-112. Utilizing this second CMP step effectively removes the doped polysilicon residues and planarizes the surface of the silicon oxide. The processing time of the two-step CMP process is significantly less than the processing time of a one-step CMP process requiring an over-polish period. This reduced processing time reduces the cost of the CMP operation an at the same time produces a product with superior planarity and without reliability degradation due to residues of doped polysilicon. As shown in FIG. 3C, after the two-step CMP process the surface 46 of the silicon oxide 36 is planar and without residues of the doped polysilicon 38.

Figure 4A:
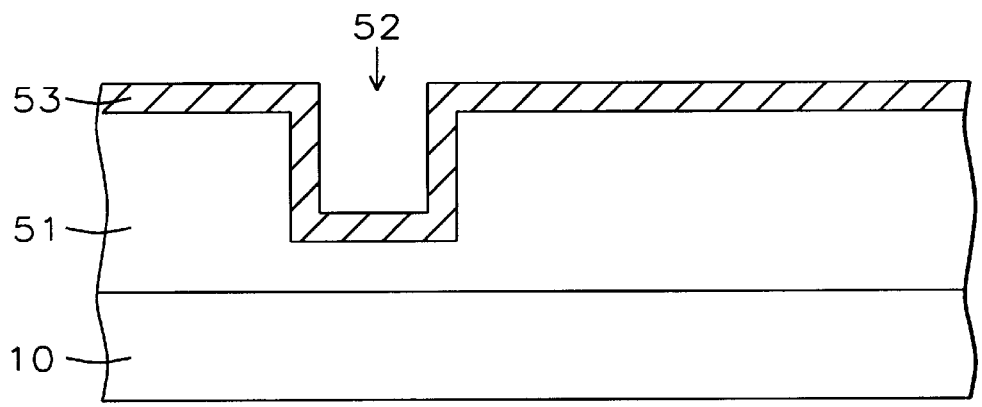
FIGS. 4A–4C, which in cross-sectional representation illustrate the method of a third embodiment of the present invention.
Figure 4B:
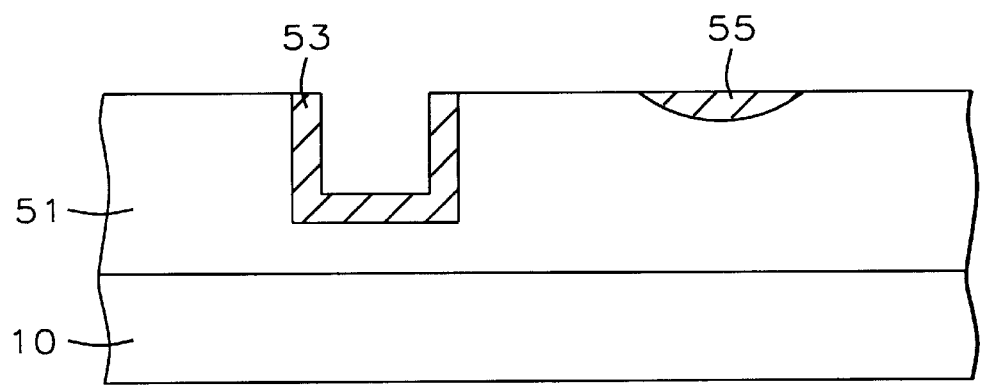
Figure 4C:
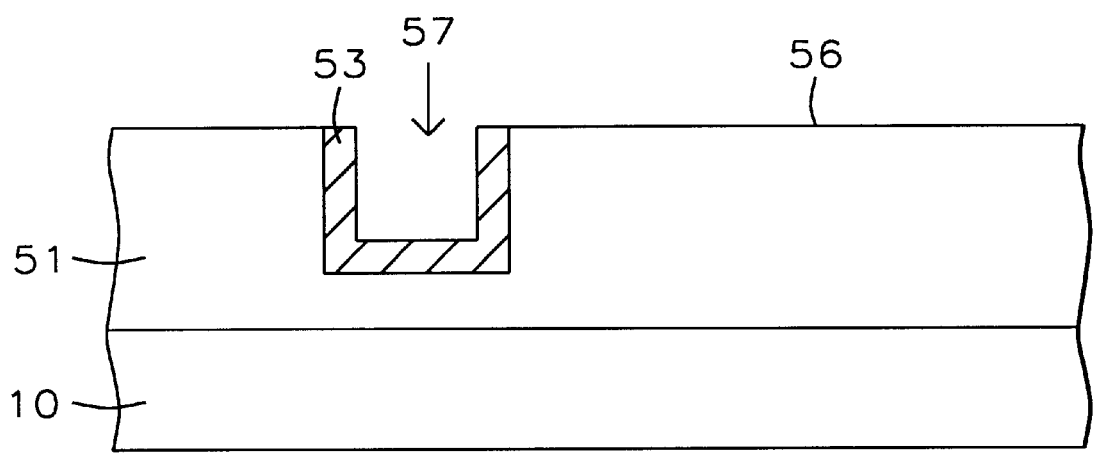

A third embodiment of the present invention is illustrated in FIGS. 4A–4C. Referring to FIG. 4A, a semiconductor substrate 10 has a layer of silicon oxide 51 formed thereon and an etched cylindrical opening 52 formed in the silicon oxide layer 51. Formed on the surface of the silicon oxide layer 51 and within the cylindrical opening 52 is a doped polysilicon layer 53. The thickness of the doped polysilicon layer 53 is less than one half the diameter of the cylindrical openings. For example, the diameter of the cylindrical openings is between about 3000 and 9000 Angstroms and the thickness of the doped polysilicon layer 53 is between about 500 and 1500 Angstroms. The object of the invention is to in a cost effective manner fabricate planarized doped polysilicon cylindrical capacitors embedded in the silicon oxide layer by selectively removing the doped polysilicon layer 53 from the surface of silicon oxide layer 51 and producing a planar top surface on silicon oxide layer 51 which is free of residues of doped polysilicon layer 53.

The invention comprises using a two-step CMP process in which the first CMP step comprises chemical-mechanical polishing using a first polishing slurry which is selective to doped polysilicon. For example, a CMP slurry comprising silica or alumina abrasive particles and a chemical solution of KOH and water, having a pH between about pH=9.5 and pH=10.5, produces suitable polishing selectivity for polysilicon compared to silicon oxide. Cabot Corp., Cab-O-Sil Division produces a suitable CMP slurry and markets the slurry as SEMI-SPERSE® EP-P1000. SEMI-SPERSE® EP-P1000 polishes doped polysilicon at a rate between about 200 and 300 times faster than the polishing rate for silicon oxide. This polishing slurry allows selective removal of the doped polysilicon from the surface of the silicon oxide without removing a significant amount of the silicon oxide. However, as shown in FIG. 4B, residues 55 of the doped polysilicon layer remain depressed regions or in regions where the first CMP step is surpressed. Conventional CMP methods are to provide an over-polish period beyond the detected endpoint for removing the doped polysilicon over the silicon oxide. This over-polish period, which may be 50 to 100% greater than the detected polishing endpoint, adds additional processing time and, therefore, additional cost. Furthermore, during the CMP over-polish period excessive amount of the underlying silicon oxide may be removed on some regions of the substrate. The present invention does not utilize an over-polish period following the first CMP step, but switches to a second CMP step which comprises chemical-mechanical polishing using a second polishing slurry which polishes both doped polysilicon and silicon oxide. For example, a second polishing slurry comprising silica abrasive particles and a chemical solution of KOH and water, having a pH between about pH=10.20 and pH=10.35, polishes polysilicon and silicon oxide at approximately equal rates. Cabot Corp., Cab-O-Sil Division produces a suitable CMP slurry and markets the slurry as CAB-O-SPERSE® SC-112. Utilizing this second CMP step effectively removes the doped polysilicon residues and planarizes the surface of the silicon oxide. The processing time of the two-step CMP process is significantly less than the processing time of a one-step CMP process requiring an over-polish period. This reduced processing time reduces the cost of the CMP operation and at the same time produces a product with superior planarity and without reliability degradation due to residues of doped polysilicon. As shown in FIG. 4C, after the two-step CMP process the surface 56 of the silicon oxide 51 is planar and without residues of the doped polysilicon 53. And embedded within the planar silicon oxide is a cylindrical doped polysilicon capacitor 57.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a planarized structure on a semiconductor substrate, wherein a second material is embedded in a first material, the method comprising the following steps:

providing a semiconductor substrate having a layer of first material deposited thereon and into which are etched contact openings;

providing a layer of second material above the layer of first material and within the contact openings;

chemical-mechanical polishing the layer of second material to the layer of first material by a two-step process, the first CMP step comprising chemical-mechanical polishing using a first polishing slurry which is selective to said second material; and further chemical-mechanical polishing the layer of second material by a second CMP step comprising chemical-mechanical polishing using a second polishing slurry which polishes both the second material and the first material.

2. The method of claim 1, wherein said layer of first material is a dielectric.

3. The method of claim 2, wherein said dielectric is silicon oxide.

4. The method of claim 1, wherein said layer of second material is a conductor.

5. The method of claim 1, wherein said first CMP step uses a first polishing slurry which selectively polishes the second material while minimally polishing the first material.

6. The method of claim 1, wherein said second CMP step uses a second polishing slurry which polishes the second material and the first material at about equal removal rates.

7. The method of claim 5, wherein said first CMP step is continued for a time sufficient to begin to expose the first material.

8. The method of claim 6, wherein said second CMP step is used to remove residues of the second material following said first CMP step.

* * * * *